US009644869B2

(12) United States Patent
Weber et al.

(10) Patent No.: US 9,644,869 B2
(45) Date of Patent: May 9, 2017

(54) SYSTEM AND METHOD FOR COOLING STRUCTURES HAVING BOTH AN ACTIVE STATE AND AN INACTIVE STATE

(75) Inventors: Richard M. Weber, Prosper, TX (US); Brandon H. Allen, Wylie, TX (US); Daniel J. Weissmann, Allen, TX (US); William G. Wyatt, Plano, TX (US)

(73) Assignee: RAYTHEON COMPANY, Waltham, MA (US)

( * ) Notice: Subject to any disclaimer, the term of this patent is extended or adjusted under 35 U.S.C. 154(b) by 1740 days.

(21) Appl. No.: 11/924,335

(22) Filed: Oct. 25, 2007

(65) Prior Publication Data

US 2009/0107663 A1   Apr. 30, 2009

(51) Int. Cl.
*F24H 3/00* (2006.01)
*F28F 7/00* (2006.01)
(Continued)

(52) U.S. Cl.
CPC ............ *F25B 23/006* (2013.01); *F28D 15/00* (2013.01); *H01Q 1/02* (2013.01); *H05K 7/20281* (2013.01)

(58) Field of Classification Search
CPC .......................... F25B 23/006; H05K 7/20281
(Continued)

(56) References Cited

U.S. PATENT DOCUMENTS 1,004,212 A * 9/1911 Smith ........................... 415/206
2,466,440 A * 4/1949 Kiekhaefer ............... F03C 2/30
                                                                 416/240
(Continued)

FOREIGN PATENT DOCUMENTS

EP          91228 A1 * 10/1983
EP         0 243 239      4/1987
(Continued)

OTHER PUBLICATIONS

PCT Search Report and Notification of Transmittal of The International Search Report and the Written Opinion of the International Searching Authority, or the Declaration, dated Dec. 11, 2008, 17 pages.
(Continued)

*Primary Examiner* — Jianying Atkisson
*Assistant Examiner* — Paul Alvare (57) ABSTRACT

According to one embodiment, a cooling system for heat-generating structures comprises a cooling loop and a heat exchanger. The cooling loop directs a flow of a fluid coolant to both an active heat-generating structure and an inactive heat-generating structure. The fluid coolant receiving thermal energy from the active heat-generating structure and transfers thermal energy to the inactive heat-generating structure when a temperature of the fluid coolant is greater than an ambient temperature of an environment surrounding the heat-generating structures. The active heat-generating structure is operable to switch to an inactive state and the inactive heat-generating structure is operable to switch to an active state. The heat exchanger is in thermal communication with the first and second heat-generating structures and is operable to receive the fluid coolant at a first temperature and dispense of the fluid coolant out of the heat exchanger at a second temperature.

20 Claims, 4 Drawing Sheets

(51) Int. Cl.

| | | |
|---|---|---|
| *F28F 27/02* | (2006.01) | |
| *H05K 7/20* | (2006.01) | |
| *F16K 31/12* | (2006.01) | |
| *F25B 23/00* | (2006.01) | |
| *F28D 15/00* | (2006.01) | |
| *H01Q 1/02* | (2006.01) | |

(58) Field of Classification Search
USPC ........ 165/47, 80.4, 80.5, 100, 201; 361/699, 361/702; 62/259.2; 137/504
See application file for complete search history.

(56) References Cited

U.S. PATENT DOCUMENTS

| | | | |
|---|---|---|---|
| 2,821,271 A * | 1/1958 | Sanford | 188/264 D |
| 3,014,429 A * | 12/1961 | Doble | F04C 2/44 418/154 |
| 3,394,655 A * | 7/1968 | Brown | 417/80 |
| 4,766,928 A * | 8/1988 | Golestaneh | 137/504 |
| 5,174,330 A * | 12/1992 | Golestan et al. | 137/504 |
| 5,398,519 A * | 3/1995 | Weber et al. | 62/201 |
| 5,459,474 A * | 10/1995 | Mattioli et al. | 361/699 |
| 5,765,511 A * | 6/1998 | Schatz | 237/12.3 B |
| 5,787,855 A * | 8/1998 | Mueller et al. | 123/198 F |
| 5,832,991 A * | 11/1998 | Cesaroni | 165/160 |
| 5,852,563 A * | 12/1998 | Weber et al. | 700/282 |
| 6,094,925 A | 8/2000 | Arshansky et al. | |
| 6,205,803 B1 | 3/2001 | Scaringe | |
| 6,519,148 B2 * | 2/2003 | Nakagawa et al. | 165/80.4 |
| 6,952,345 B2 * | 10/2005 | Weber et al. | 361/699 |
| 7,000,691 B1 * | 2/2006 | Weber | 165/96 |
| 7,017,651 B1 * | 3/2006 | Wilson et al. | 165/80.4 |
| 7,254,957 B2 * | 8/2007 | Weber et al. | 62/259.2 |
| 2003/0094006 A1 | 5/2003 | Des Champs et al. | |
| 2003/0140638 A1 | 7/2003 | Arshansky et al. | |
| 2004/0231351 A1 * | 11/2004 | Wyatt | F25B 23/006 62/259.2 |

FOREIGN PATENT DOCUMENTS

| | | |
|---|---|---|
| EP | 1 217 879 | 12/2001 |
| EP | 1 380 799 | 7/2003 |
| EP | 1 796 447 | 11/2006 |
| GB | 2 387 276 | 10/1999 |
| JP | 62093426 A * | 4/1987 |
| WO | WO 02/13264 | 6/2002 |

OTHER PUBLICATIONS

Declaration of Richard M. Weber, dated Feb. 13, 2013, 2 pages.

* cited by examiner

SYSTEM AND METHOD FOR COOLING STRUCTURES HAVING BOTH AN ACTIVE STATE AND AN INACTIVE STATE

TECHNICAL FIELD OF THE INVENTION

This invention relates generally to the field of cooling systems and, more particularly, to a system and method for cooling structures having both an active state and an inactive state.

BACKGROUND OF THE INVENTION

A variety of different types of structures can generate heat or thermal energy in operation. To prevent such structures from over heating, a variety of different types of cooling systems may be utilized to dissipate the thermal energy. The ability to cool may be limited, however, by the amount of structures needing to be cooled and the current state of each structure (i.e. active, inactive, standby).

SUMMARY OF THE INVENTION

According to one embodiment, a cooling system for heat-generating structures comprises a cooling loop and a heat exchanger. The cooling loop directs a flow of a fluid coolant to both an active heat-generating structure and an inactive heat-generating structure. The fluid coolant receiving thermal energy from the active heat-generating structure and transfers thermal energy to the inactive heat-generating structure when a temperature of the fluid coolant is greater than an ambient temperature of an environment surrounding the heat-generating structures. The active heat-generating structure is operable to switch to an inactive state and the inactive heat-generating structure is operable to switch to an active state. The heat exchanger is in thermal communication with the first and second heat-generating structures and is operable to receive the fluid coolant at a first temperature and dispense of the fluid coolant out of the heat exchanger at a second temperature.

Certain embodiments of the invention may provide numerous technical advantages. For example, a technical advantage of one embodiment may include the capability to prevent the thermal shock associated with activating a previously inactive structure. For example, the same fluid coolant used to cool an active structure may also be used to heat an inactive structure, keeping the inactive structure at an optimum working temperature. Other technical advantages of other embodiments may include the capability to cool a phased array antenna located on a mast of a ship. Still yet other technical advantages of other embodiments may include the capability to use sensors to measure the health of a cooling system.

Although specific advantages have been enumerated above, various embodiments may include all, some, or none of the enumerated advantages. Additionally, other technical advantages may become readily apparent to one of ordinary skill in the art after review of the following figures and description.

BRIEF DESCRIPTION OF THE DRAWINGS

For a more complete understanding of example embodiments of the present invention and its advantages, reference is now made to the following description, taken in conjunction with the accompanying drawings, in which.

DETAILED DESCRIPTION OF EXAMPLE EMBODIMENTS OF THE INVENTION

It should be understood at the outset that although example embodiments of the present invention are illustrated below, the present invention may be implemented using any number of techniques, whether currently known or in existence. The present invention should in no way be limited to the example embodiments, drawings, and techniques illustrated below, including the embodiments and implementation illustrated and described herein. Additionally, the drawings are not necessarily drawn to scale.

Conventionally, cooling systems may be used to cool commercial and military applications. Although these cooling systems may minimize a need for conditioned air, they may be limited by the amount of structures being cooled and the current state of each structure (i.e. active, inactive, standby).

Figure 1:
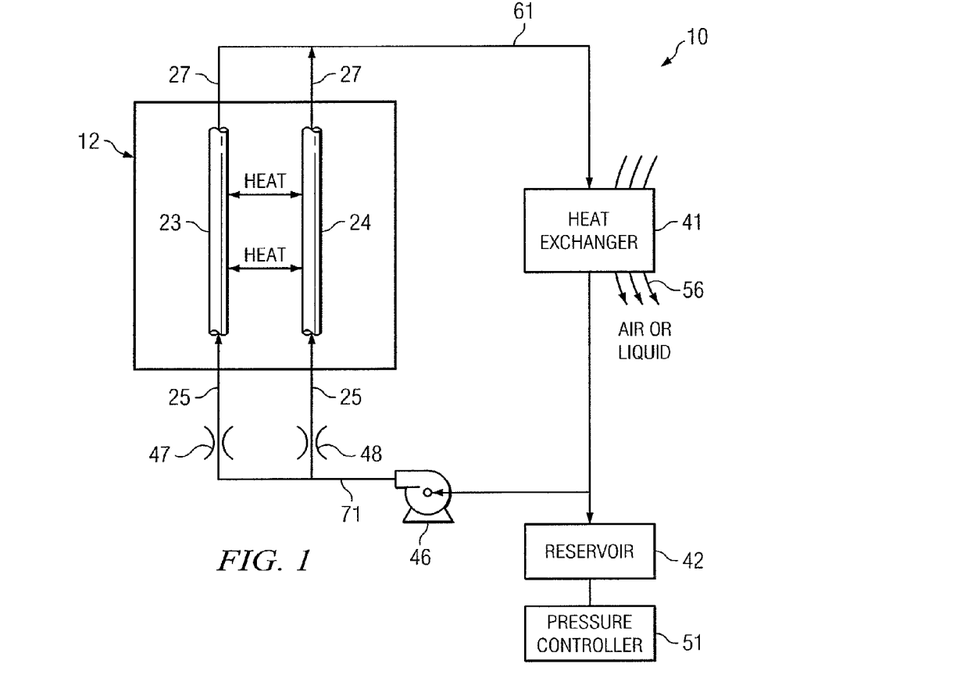
FIG. 1 is a block diagram of an embodiment of a cooling system that may be utilized in conjunction with embodiments of the present invention.

FIG. 1 is a block diagram of an embodiment of a cooling system that may be utilized in conjunction with embodiments of the present invention. Although the details of one cooling system will be described below, it should be expressly understood that other cooling systems may be used in conjunction with embodiments of the invention.

The cooling system 10 of FIG. 1 is shown cooling a structure 12 that is exposed to or generates thermal energy. The structure 12 may be any of a variety of structures, including, but not limited to, electronic components, circuits, computers, servers, and arrays of a phased array antenna. Because the structure 12 can vary greatly, the details of structure 12 are not illustrated and described. The cooling system 10 of FIG. 1 includes a heat exchanger inlet line 61, a structure inlet line 71, structure heat exchangers 23 and 24, a loop pump 46, inlet orifices 47 and 48, a heat exchanger 41, a reservoir 42, and a pressure controller 51.

The structure 12 may be arranged and designed to conduct heat or thermal energy to the structure heat exchangers 23, 24. To receive this thermal energy or heat, the structure heat exchangers 23, 24 may be disposed on an edge of the structure 12 (e.g., as a thermosyphon, heat pipe, or other device) or may extend through portions of the structure 12, for example, through a thermal plane of the structure 12. In particular embodiments, the structure heat exchangers 23, 24 may extend up to the components of the structure 12, directly receiving thermal energy from the components. Although two structure heat exchangers 23, 24 are shown in the cooling system 10 of FIG. 1, one structure heat exchanger or more than two structure heat exchangers may be used to cool the structure 12 in other cooling systems.

In operation, a fluid coolant flows through each of the structure heat exchangers 23, 24. The fluid coolant absorbs heat from the structure 12. To facilitate such absorption or transfer of thermal energy, the structure heat exchangers 23, 24 may be lined with pin fins or other similar devices which, among other things, increase surface contact between the fluid coolant and walls of the structure heat exchangers 23, 24. Additionally, in particular embodiments, the fluid coolant may be forced or sprayed into the structure heat exchangers 23, 24 to ensure fluid contact between the fluid coolant and the walls of the structure heat exchangers 23, 24. In one embodiment, the fluid coolant may remain in a liquid phase after absorption of heat from the structure 12. In a further embodiment, the absorption of heat from the structure 12 may cause at least a portion of the fluid coolant to vaporize.

The fluid coolant departs the exit conduits 27 and flows through the heat exchanger inlet line 61, the heat exchanger 41, the reservoir 42, a loop pump 46, the structure inlet line 71, and a respective one of two orifices 47 and 48, in order to again reach the inlet conduits 25 of the structure heat exchangers 23, 24. The loop pump 46 may cause the fluid coolant to circulate around the loop shown in FIG. 1. In particular embodiments, the loop pump 46 may use magnetic drives so there are no shaft seals that can wear or leak with time. In one embodiment, the loop pump 46 may control the mass flow rate of the fluid coolant in the loop. For example, the loop pump 46 may increase, decrease, or keep the mass flow rate of the fluid coolant constant.

The orifices 47 and 48, in particular embodiments, may facilitate proper partitioning of the fluid coolant among the respective structure heat exchangers 23, 24, and may also help to create a large pressure drop between the output of the loop pump 46 and the heat exchangers 23, 24. The orifices 47 and 48 may have the same size, or may have different sizes in order to partition the coolant in a proportional manner which facilitates a desired cooling profile.

A flow 56 of fluid (either gas or liquid) may be forced to flow through the heat exchanger 41, for example by a fan (not shown) or other suitable device. In particular embodiments, the flow 56 of fluid may be ambient fluid. The heat exchanger 41 transfers heat from the fluid coolant to the flow 56 of ambient fluid, thereby reducing the temperature of the fluid coolant. In one embodiment, the fluid coolant may be in a liquid phase prior to entering the heat exchanger 41. In this embodiment, the transfer of heat to the flow 56 may not cause the fluid coolant to change phases. In another embodiment, at least a portion of the fluid coolant may be in a vapor phase prior to entering the heat exchanger 41. In such an embodiment, the transfer of heat from the vapor fluid coolant to the flow 56 may further cause the fluid coolant to condense into a liquid phase.

The fluid coolant exiting the heat exchanger 41 may be supplied to the reservoir 42. In one embodiment, the reservoir 42 may store the fluid coolant when the cooling system 10 is not in operation. In a further embodiment, the reservoir 42 may be an expansion reservoir. Since fluids typically take up more volume in their vapor phase than in their liquid phase, the expansion reservoir may be provided in order to take up the volume of liquid fluid coolant that is displaced when some or all of the coolant in the system changes from its liquid phase to its vapor phase.

The fluid coolant used in the embodiment of FIG. 1 may include, but is not limited to, mixtures of antifreeze and water or water, alone. In particular embodiments, the antifreeze may be ethanol, methanol, or other suitable antifreeze. In other embodiments, the fluid coolant may include polyalphaolefin (PAO), a mixture of water and propylene glycol (PGW), a mixture of water and ethylene glycol (EGW), HFC-134a, Coolanol, ammonia, brine, or any other suitable fluid coolant.

The pressure controller 51 maintains the fluid coolant at a substantially constant pressure along the portion of the loop which extends from the orifices 47 and 48 to the loop pump 46, in particular through the structure heat exchangers 23 and 24, the heat exchanger 41, and the reservoir 42. In particular embodiments, metal bellows may be used in the reservoir 42, connected to the loop using brazed joints. In particular embodiments, the pressure controller 51 may control loop pressure by using a motor driven linear actuator that is part of the metal bellows of the reservoir 42, or by using a small gear pump to evacuate the loop to the desired pressure level. The fluid coolant removed may be stored in the metal bellows whose fluid connects are brazed. In other configurations, the pressure controller 51 may utilize other suitable devices capable of controlling pressure.

It will be noted that the embodiment of FIG. 1 may operate without a refrigeration system. In the context of electronic circuitry, such as may be utilized in the structure 12, the absence of a refrigeration system can result in a significant reduction in the size, weight, and power consumption of the structure provided to cool the circuit components of the structure 12.

In particular embodiments of a cooling system, more than one structure may need to be cooled. For example, cooling may be required for more than one server, or more than one array of a phased array antenna. In a further embodiment, a structure may not be in use at all times. For example, there may be times when a structure, such as an array of a phased array antenna, is turned off, or placed in a standby mode. As a result, the structure may not be exposed to, or may not be generating thermal energy. Therefore, the structure may not need to be cooled while not in use.

Figure 2:
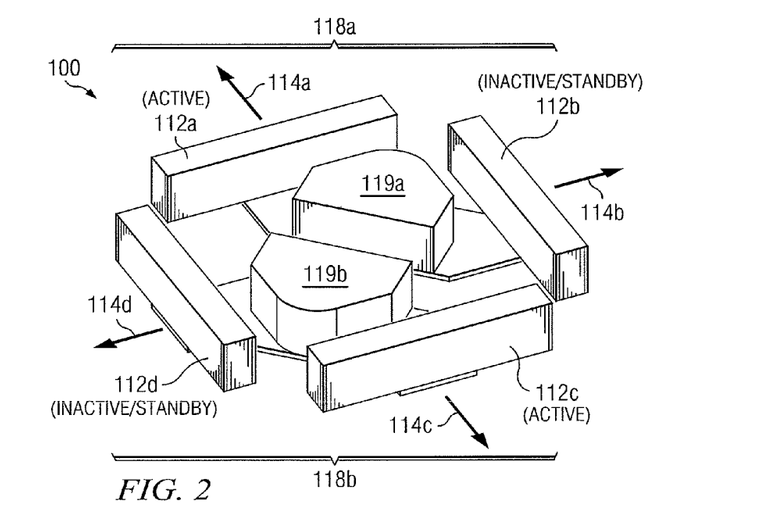
FIG. 2 is a diagram of one embodiment of a system with more than one structure needing to be cooled.

FIG. 2 is a diagram of one embodiment of a system 100 with more than one structure needing to be cooled. According to the illustrated embodiment, system 100 includes structures 112a-d.

The structures 112 may be substantially similar to the structure 12 of FIG. 1. For example, the structures 112 may be any of a variety of structures, including, but not limited to, electronic components, circuits, computers, servers, and arrays of a phased array antenna. In one embodiment, each of the structures 112a-d may be the same type of structure. For example, each of the structures 112a-d may be a computer. In a further embodiment, one or more of the structures 112a-d may be a different type of structure. For example, the structure 112a may be a computer while the structure 112b may be a circuit.

According to the illustrated embodiment, the structures 112 face directions 114a-d. As illustrated, the directions 114a-d may each be a different direction. In such an embodiment, the structures 112a-d may each face a different direction 114. As illustrated, the direction 114a and the direction 114c may be opposite directions. For example, the direction 114a and direction the 114c may be angled 180° apart. In a further illustrated embodiment, the direction 114b and the direction 114d may also be opposite directions, and thus, may also be angled 180° apart. In an embodiment where the structures 112 are located on an object, the directions 114 may represent areas of the object. For example, when the structures 112 are located on a ship, the directions 114a and 114c, for example, may represent either fore and aft of the ship, or port and starboard of the ship. Although the directions 114 are illustrated as being different directions, each of the directions 114a-d may be the same direction, or may be separated by a different degree of angle. In an embodiment where the directions 114a-d are the same direction, the structures 112a-d may be facing the same direction.

As discussed above, the structures 112 may not be active at all times. For example, the structures 112 may be arrays of a phased array antenna. Each of the structures 112a-d, therefore, may not all be active at the same time. For example, only the structures 112a and 112c may be active at a certain time. In one embodiment, when the structures 112a and 112c are active, the structures 112b and 112d may not be active. In a further embodiment, when the structures 112b and 112d are active, the structures 112a and 112c may not be active. As a result, only the structures 112a and 112c, or the structures 112b and 112d are exposed to, or generating thermal energy at one time.

As further illustrated, the system 100 also includes structure groups 118a and 118b. The structure groups 118 may include one or more of the structures 112. For example, the structure group 118a may include the structures 112a and 112b, and the structure group 118b may include the structures 112c and 112d. In another embodiment, the structure group 118a may include one currently active structure 112, and one currently inactive (standby) structure 112. For example, according to the illustrated embodiment, the structure 112a of the structure group 118a may be active, while the structure 112b of the structure group 118a may be inactive. As a result, only one of the structures 112 of each of the structure groups 118 is active at one time. As further illustrated, each of the structure groups 118 may further include a cooling system 119. For example, the structure group 118a includes the cooling system 119a, and the structure group 118b includes the cooling system 119b. In one embodiment, the cooling systems 119 may be operable to cool the structures 112, as discussed further in FIG. 3.

Various problems exist in conventional techniques for cooling multiple structures that may not be active at all times. For example, one conventional technique for cooling multiple structures includes providing a cooling system for each structure. For example, in a system with four structures needing to be cooled, the conventional system would also include four cooling systems, one for each structure. This technique, however, may result in an unnecessary amount of weight encumbering the conventional system. In particular, when one structure is inactive, and therefore not being exposed to, or generating thermal energy, the cooling system for that structure is unnecessary. As a result, the cooling system adds additional weight to the conventional system without creating a benefit for the conventional system. For example, in a system, such as described in FIG. 2, including four structures, but having only two of the structures active at any one time, the conventional system would always have two cooling systems (50 percent of the cooling systems) that are never in use, and are merely adding extra weight.

A further conventional technique includes multiple structures, but only one cooling system. For example, when the system includes four structures, such as described in FIG. 2, only one cooling system would provide the cooling for all of the structures. However, in a system where not all of the structures are active at all times, such as described above, the inactive structures do not need to be cooled. Therefore, the conventional technique further includes a valve system that diverts the fluid coolant to only the structures in use. Unfortunately, many structures, such as circuits, computers, servers, and arrays of phased array antenna, are used in environments with extremely cold temperatures. In such an environment, when a structure is not being exposed to, or generating thermal energy, the environment causes the temperature of the structure to decrease below an optimum working temperature. As a result, when a structure is activated from an inactive or standby state, the structure may receive a thermal shock caused by the low temperature. In one embodiment, this may reduce the productivity and efficiency of the structure. Unfortunately, the single cooling system utilizing valves fails to provide a solution to this thermal shock.

Accordingly, teachings of some embodiments of the present invention recognize a system capable of reducing the thermal shock associated with activating an inactive structure, and further capable of reducing the number of cooling systems needed to cool more than one heat-generating structure.

Figure 3:
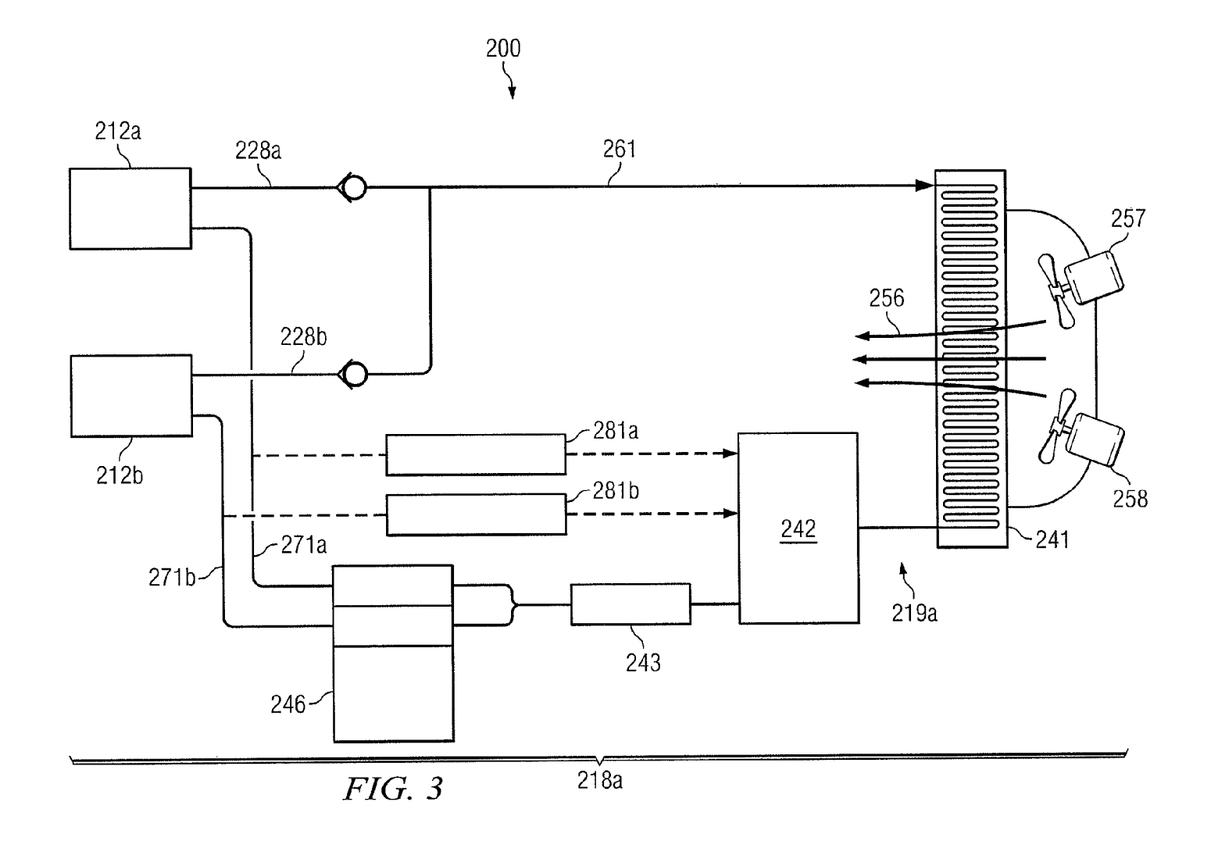
FIG. 3 is a block diagram of an embodiment of a cooling system that may cool more than one heat-generating structure.

FIG. 3 is a block diagram of an embodiment of a cooling system 200 for cooling more than one heat-generating structure according to an embodiment of the invention. As illustrated, the cooling system 200 includes two structures 212a and 212b, and a pump 246. According to one embodiment, the pump 246 provides each of the structures 212a-b with fluid coolant even when one of the structures 212 is inactive. As a result, the supply of the fluid coolant prevents the inactive structure 212 from dropping below an optimum working temperature.

The cooling system 200 of FIG. 3 is similar to the cooling system 10 of FIG. 1 except that the cooling system 200 of FIG. 3 includes the two structures 212a and 212b, two structure inlet lines 271a and 271b, and two structure outlet lines 228a and 228b. For simplicity of FIG. 3, FIG. 3 is depicted as being less detailed than FIG. 1. However, in certain embodiments, the cooling system 200 of FIG. 3 may contain each of the elements of cooling system 10, fewer elements than cooling system 10, or more elements than cooling system 10.

The structures 212 may be substantially similar to the structures 112a and 112b of FIG. 2. For example, as discussed in FIG. 2, the structure 212a may be active, while the structure 212b may be inactive or on standby. In one embodiment, because the structure 212b is in standby, the structure 212b is not exposed to, or generating thermal energy. As a result, the temperature of the environment surrounding the cooling system 200 may cause the temperature of the structure 212b to decrease below an optimal working temperature. In one embodiment of the present invention, the cooling system 200 may prevent this decrease in temperature.

The structure outlet lines 228a and 228b may be operable to receive the fluid coolant exiting the structures 212, and further operable to combine the fluid coolant in the heat exchanger inlet line 261. The pump 246 is similar to the pump 46 of FIG. 1. According to the illustrated, the pump 246 may be a two-section positive displacement pump. For example, a line providing fluid coolant to the pump 246 may be divided into two pump inlet lines. As a result, the pump 246 may not need to separate the fluid coolant because the separation may occur prior to the fluid coolant entering the pump 246. In one embodiment, the pump 246 evenly distributes the fluid coolant between the structure inlet lines 271. In another embodiment, the pump 246 may include two separate pumps. In such an embodiment, the pumps 246 may each receive fluid coolant from separate pump inlet lines, and each of the pumps 246 may provide one of the structure inlet lines 271 with the fluid coolant. According to another embodiment, each of the pumps 246 may be in communication with each other, thus allowing each of the pumps 246 to provide an equal amount of the fluid coolant to each of the structure inlet lines 271. In a further embodiment, the pump 246 may be further operable to separate the fluid coolant and provide it to the structure inlet lines 271a and 271b. As a result, the pump 246 may have only one pump inlet line.

The structure inlet lines 271 may be operable to provide the fluid coolant to the structures 212. As illustrated, the structure inlet line 271a provides the fluid coolant to the structure 212a, and the structure inlet line 271b provides the fluid coolant to the structure 212b. In one embodiment, each of the structure inlet lines 271 receives an equal amount of the fluid coolant, and further provides an equal amount of the fluid coolant to each of the structures 212. In other embodiments, each of the structure inlet lines 271 may receive a different amount of the fluid coolant, and may or may not provide an equal amount of the fluid coolant to each of the structures 212. In a further embodiment, the fluid coolant provided to the structures 212 by each of the structure inlet lines 271 may have a substantially equal fluid coolant temperature.

The cooling system 200 further includes structure group 218a and cooling system 219a. The structure group 218a is similar to the structure group 118a of FIG. 2. The cooling system 219a is similar to the cooling system 119a of FIG. 2. The structure group 218a includes both of the structures 212a and 212b, and the cooling system 119a. In operation, the cooling of the structures 212a and 212b using the cooling system 119a is substantially similar to the cooling of the structure 12 described in FIG. 1. For example, the fluid coolant flows through each of the structure heat exchangers 223, 224 (not shown), absorbing heat from each of the structures 212. The fluid coolant departs the exit conduits 227 (not shown) and flows into the respective structure outlet line 228. The structure outlet lines 228 combine the fluid coolant into the heat exchanger inlet line 261. From the heat exchanger inlet line 261, the fluid coolant flows into the heat exchanger 241.

At the heat exchanger 241, a flow 256 may be forced to flow through the heat exchanger 241 in order to absorb heat from the fluid coolant. In one embodiment, the flow 256 may be forced by fans 257 and 258. The flow 256 is similar to the flow 56 of FIG. 1.

After the heat exchanger 241 transfers heat from the fluid coolant, the fluid coolant departs the heat exchanger 241 and flows through the reservoir 242 and the loop pump 246. The loop pump 246 separates the fluid coolant and provides the fluid coolant to each of the structure inlet lines 271. In one embodiment, the pump 246 provides an equal amount of the fluid coolant to each of the structure inlet lines 271. From the structure inlet lines 271, the fluid coolant flows through a respective one of two orifices 247 and 248 (not shown) for each of the structures 212, in order to again reach the structure heat exchangers 223, 224 (not shown) for each of the structures 212.

In one embodiment, the environmental temperature may cause the inactive structure 212b to decrease temperature. However, the inactive structure 212b is constantly receiving a portion of the same fluid coolant that keeps the active structure 212a at a working temperature. As a result, when the temperature of the inactive structure 212b decreases below the temperature of the fluid coolant entering the inactive structure 212b, the fluid coolant transfers heat to the inactive structure 212b, as apposed to absorbing heat, such as occurs in the active structure 212a. Because heat is transferred to the structure 212b, the structure 212b may remain at an optimum working temperature despite its inactive status and the environmental temperature. In one embodiment, the temperature of the structure 212b may decrease below the temperature of the fluid coolant entering the structure 212b because the environmental temperature is lower than that of the fluid coolant.

In a further embodiment, the system 200 also includes a structure group 218b (not shown). The structure group 218b may include structures 212c and 212d (not shown), and an additional cooling loop 219b (not shown), as discussed in FIG. 2. The operations of the structure group 218b is similar to the operation of the structure group 218a discussed above. In one embodiment, the structures 212c and 212d are similar to the structures 112c and 112d of FIG. 2, and the cooling loop 219b is similar to the cooling loop 119b of FIG. 2. With both of the structure groups 218, the system 200 may include four structures 212a-d, and two cooling loops 219a-b.

In another embodiment, the system 200 may include relief valves 281a and 281b. The relief valves 281 may be operable to reduce pressure in the system 200. For example, the relief valves 281 may be operable to remove at least a portion of the fluid coolant from the structure inlet lines 271, and provide the removed fluid coolant back to the reservoir 242. As a result, the relief valves 281 may prevent damage to the system 200 when the pressure of the system 200 becomes too great. In one embodiment, the relief valves 281 may be controlled by a pressure controller, such as the pressure controller 51 of FIG. 1. In a further embodiment, the system 200 may include a filter 243. The filter 243 may be operable to maintain the integrity of the fluid coolant entering the pump 246.

Figure 4:
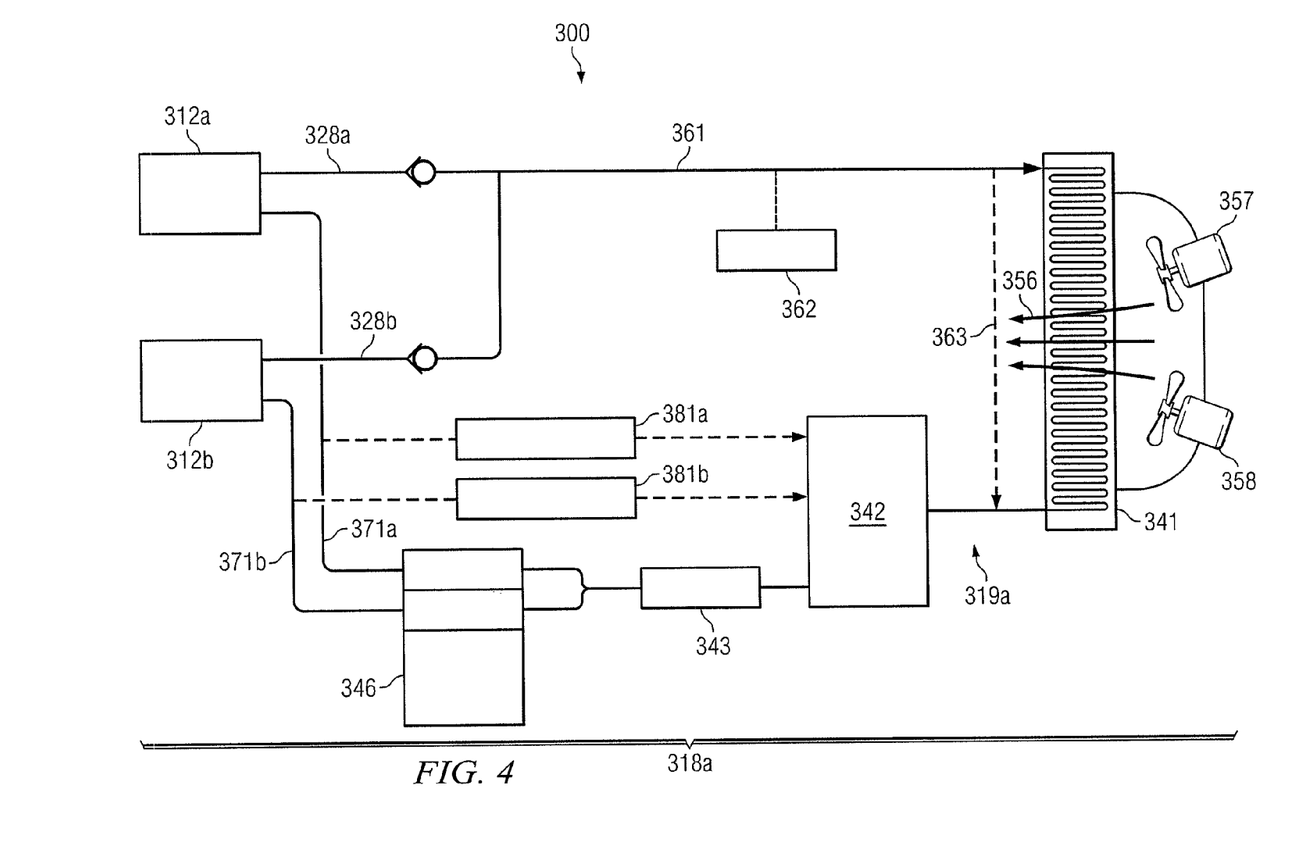
FIG. 4 is a block diagram of an embodiment of a cooling system that may cool more than one heat-generating structure.

FIG. 4 is a block diagram of an embodiment of a cooling system 300 for cooling more than one heat-generating structure according to an embodiment of the invention. The cooling system 300 of FIG. 4 is similar to the cooling system 200 of FIG. 3 except that the cooling system 300 of FIG. 4 includes a sensor 362 and a bypass line 363. The other components of cooling system 300 are similar to those referred to in cooling system 200 of FIG. 3.

The sensor 362 may be operable to measure the temperature of the fluid coolant passing through the heat exchanger inlet line 361. Based on this measurement, the sensor 362 may, in one embodiment, determine that the temperature of the fluid coolant does not need to be decreased. Accordingly, bypass line 363 may direct the fluid coolant to the reservoir 342 without passing through the heat exchanger 341. As a result, the temperature of the fluid coolant may remain substantially constant between structures 312 and reservoir 342.

Figure 5:
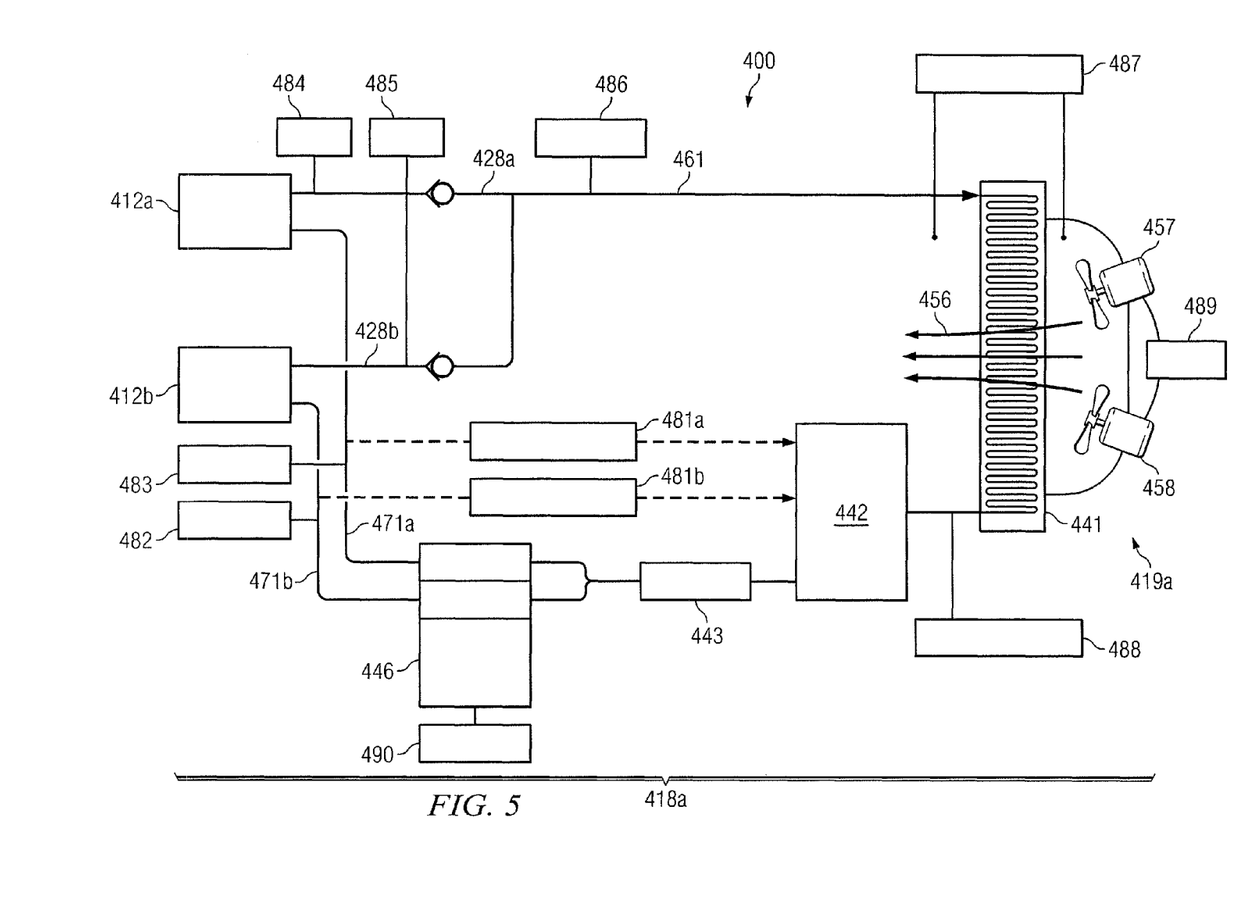
FIG. 5 is a block diagram of an embodiment of a cooling system that may cool more than one heat-generating structure.

FIG. 5 is a block diagram of an embodiment of a cooling system 400 for cooling more than one heat-generating structure according to an embodiment of the invention. The cooling system 400 of FIG. 5 is similar to the cooling system 200 of FIG. 3 except that the cooling system 400 of FIG. 5 includes sensors 482-490. The other components of cooling system 400 are similar to those referred to in cooling system 200 of FIG. 3.

In one embodiment, the sensors 482-490 may be operable to provide a diagnosis and/or prognosis of the health of the system 400. For example, the sensors 482-490 may be operable to measure the pump power of the pump 446, the fan power of the fans 457 and 458, the temperature of the fluid coolant throughout the system 400, and/or the pressure of the system 400. In one embodiment, the sensors 482 and 483 may be operable to measure the fluid coolant pressure at the structure inlet lines 471. In another embodiment, the sensors 484 and 485 may be operable to measure the temperature of the fluid coolant at the structure outlet lines 428. In a further embodiment, the sensor 486 may be operable to measure the pressure of the fluid coolant at the heat exchanger inlet line 461. In a further embodiment, the sensor 487 may be operable to measure the pressure drop at the heat exchanger 441. In a further embodiment, the sensor 488 may be operable to measure the pressure inbetween the heat exchanger 441 and the reservoir 442. In a further embodiment, the sensor 489 may be operable to measure the power (voltage/current) of the fans 457 and 458 forcing the flow 456 through the heat exchanger 441. In a further embodiment, the sensor 490 may be operable to measure the power (voltage/current) of the pump 446. According to one embodiment, the sensors 482-490 of the system 400 may allow the performance of individual components of the system 400 to be measured, or the entire performance of the system 400 to be measured. Based on these measurements, in one embodiment, changes can be made to the system 400 to fix problems that have occurred, problems that may occur, or problems that are imminent.

Although the present invention has been described with several embodiments, a myriad of changes, variations, alterations, transformations, and modifications may be suggested to one skilled in the art, and it is intended that the present invention encompass such changes, variations, alterations, transformation, and modifications as they fall within the scope of the appended claims.

What is claimed is:

1. A cooling system comprising:
   a cooling loop configured to:
      provide, from a pump, a flow of a fluid coolant in parallel to two or more heat-generating structures, the pump configured to provide the flow of the fluid coolant through separate paths of fluid communication between the pump and the two or more heat-generating structures, the pump comprising a positive-displacement pump having multiple sections, each section of the positive-displacement pump having a pump inlet and a pump outlet associated only with that section, each of the two or more heat-generating structures configured to alternate between being active and being inactive, at least one of the two or more heat-generating structures configured to be active only while another of the two or more heat-generating structures is inactive and vice versa;
      allow portions of the fluid coolant provided to each of the two or more heat-generating structures to:
         receive thermal energy from the respective heat-generating structure when the respective heat-generating structure is active and generating heat such that the fluid coolant has a temperature less than the respective heat-generating structure, and
         dispense thermal energy to the respective heat-generating structure when the respective heat-generating structure is inactive and not generating heat such that the fluid coolant has a temperature greater than the respective heat-generating structure;
      combine the portions of the fluid coolant provided to the two or more heat-generating structures; and
      exchange thermal energy received from the two or more heat-generating structures to reduce a temperature of the combined fluid coolant.

2. The cooling system of claim 1, wherein the two or more heat-generating structures comprise two heat-generating structures, and wherein each section of the positive displacement pump is configured to separately provide the fluid coolant to a corresponding one of the two heat-generating structures.

3. The cooling system of claim 1, wherein the separate paths of fluid communication between the pump and the two or more heat-generating structures lack valves.

4. The cooling system of claim 1, wherein each of the two or more heat-generating structures comprises a separate array of a phased array antenna.

5. The cooling system of claim 1, further comprising:
   a heat exchanger configured to exchange the thermal energy received from the two or more heat-generating structures to reduce the temperature of the combined fluid coolant.

6. The cooling system of claim 5, wherein the heat exchanger is a liquid-air heat exchanger.

7. The cooling system of claim 5, wherein the heat exchanger is a liquid-liquid heat exchanger.

8. A cooling system comprising:
   a cooling loop having a pump configured to provide a flow of fluid coolant in parallel to two or more heat-generating structures, the cooling loop including separate paths of fluid communication between the pump and the two or more heat-generating structures, the pump comprising a positive-displacement pump having multiple sections, each section of the positive-displacement pump having a pump inlet and a pump outlet associated only with that section, each of the two or more heat-generating structures configured to alternate between being active and being inactive, at least one of the two or more heat-generating structures configured to be active only while another of the two or more heat-generating structures is inactive and vice versa;
   wherein the cooling loop is configured to:
      allow portions of the fluid coolant provided to each of the two or more heat-generating structures to receive thermal energy from the respective heat-generating structure when the fluid coolant has a temperature less than the respective heat-generating structure and to dispense thermal energy to the respective heat-generating structure when the fluid coolant has a temperature greater than the respective heat-generating structure;
      combine the portions of the fluid coolant provided to the two or more heat-generating structures; and
      exchange thermal energy received from the two or more heat-generating structures to reduce a temperature of the combined fluid coolant.

9. The cooling system of claim 8, wherein the two or more heat-generating structures comprise two heat-generating structures, and wherein each section of the positive displacement pump is configured to separately provide the fluid coolant to a corresponding one of the two heat-generating structures.

10. The cooling system of claim 8, wherein the separate paths of fluid communication between the pump and the two or more heat-generating structures lack valves.

11. The cooling system of claim 8, further comprising:
    a heat exchanger configured to exchange the thermal energy received from the two or more heat-generating structures to reduce the temperature of the combined fluid coolant.

12. The cooling system of claim 11, wherein the heat exchanger is a liquid-air heat exchanger.

13. The cooling system of claim 11, wherein the heat exchanger is a liquid-liquid heat exchanger.

14. A method comprising:
    providing, from a pump, a flow of a fluid coolant in parallel to two or more heat-generating structures, the flow of the fluid coolant occurring through separate paths of fluid communication between the pump and the two or more heat-generating structures, the pump comprising a positive-displacement pump having multiple sections, each section of the positive-displacement pump having a pump inlet and a pump outlet associated only with that section;

alternating, by each of the two or more heat-generating structures, between active and inactive states such that at least one of the two or more heat-generating structures is configured to be active only while another of the two or more heat-generating structures is inactive and vice versa;

allowing portions of the fluid coolant provided to each of the two or more heat-generating structures to:
 receive thermal energy from the respective heat-generating structure when the respective heat-generating structure is active and generating heat such that the fluid coolant has a temperature less than the respective heat-generating structure, and
 dispense thermal energy to the respective heat-generating structure when the respective heat-generating structure is inactive and not generating heat such that the fluid coolant has a temperature greater than the respective heat-generating structure;

combining the portions of the fluid coolant provided to the two or more heat-generating structures; and exchanging thermal energy received from the two or more heat-generating structures to reduce a temperature of the combined fluid coolant.

15. The method of claim 14, wherein the two or more heat-generating structures comprise two heat-generating structures, and wherein each section of the positive displacement pump separately provides the fluid coolant to a corresponding one of the two heat-generating structures.

16. The method of claim 14, wherein the separate paths of fluid communication between the pump and the two or more heat-generating structures lack valves.

17. The method of claim 14, wherein each of the two or more heat-generating structures comprises a separate array of a phased array antenna.

18. The method of claim 14, wherein a heat exchanger exchanges the thermal energy received from the two or more heat-generating structures to reduce the temperature of the combined fluid coolant.

19. The method of claim 18, wherein the heat exchanger is a liquid-air heat exchanger.

20. The method of claim 18, wherein the heat exchanger is a liquid-liquid heat exchanger.

* * * * *